United States Patent
Yang

(10) Patent No.: US 9,361,954 B2
(45) Date of Patent: Jun. 7, 2016

(54) MEMORY DEVICE, MEMORY SYSTEM AND OPERATING METHOD THEREOF

(71) Applicant: SK hynix Inc., Gyeonggi-do (KR)

(72) Inventor: Jong-Yeol Yang, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 7 days.

(21) Appl. No.: 14/109,716

(22) Filed: Dec. 17, 2013

(65) Prior Publication Data

US 2015/0043294 A1 Feb. 12, 2015

(30) Foreign Application Priority Data

Aug. 9, 2013 (KR) ........................ 10-2013-0094781

(51) Int. Cl.
| | |
|---|---|
| *G11C 7/00* | (2006.01) |
| *G11C 7/02* | (2006.01) |
| *G11C 11/406* | (2006.01) |

(52) U.S. Cl.
CPC ............ *G11C 7/02* (2013.01); *G11C 11/40611* (2013.01); *G11C 11/40615* (2013.01); *G11C 2211/4061* (2013.01)

(58) Field of Classification Search
USPC ........................................................ 365/222
See application file for complete search history.

(56) References Cited

U.S. PATENT DOCUMENTS

| | | | | |
|---|---|---|---|---|
| 2006/0198226 | A1* | 9/2006 | Takahashi et al. | ............ 365/222 |
| 2012/0014199 | A1* | 1/2012 | Narui | ............................ 365/222 |

FOREIGN PATENT DOCUMENTS

| | | |
|---|---|---|
| KR | 1020070102235 | 10/2007 |
| KR | 1020120020395 | 3/2012 |

* cited by examiner

*Primary Examiner* — Anthan Tran
(74) *Attorney, Agent, or Firm* — IP & T Group LLP

(57) ABSTRACT

A memory device comprises a cell array having a plurality of word lines, an address counting unit suitable for generating a counting address that is changed whenever one or more of the plurality of word lines are refreshed, and a control unit suitable for selecting a word line corresponding to the counting address among the plurality of word lines and refreshing the selected word line within a first period in response to a refresh command during a first operation mode, within a second period that is longer than the first period during a second operation mode, and within a third period that is shorter than the second period in a high frequency section after the second operation mode begins.

15 Claims, 6 Drawing Sheets

MEMORY DEVICE, MEMORY SYSTEM AND OPERATING METHOD THEREOF

CROSS-REFERENCE TO RELATED APPLICATIONS

The present application claims priority of Korean Patent Application No. 10-2013-0094781, filed on Aug. 9, 2013, which is incorporated herein by reference in its entirety.

BACKGROUND

1. Field

Exemplary embodiments of the present invention relate to a memory device, a memory system and a method for operating the memory device.

2. Description of the Related Art

A memory cell of a memory device is formed of a capacitor for storing a charge which is a data, and a transistor for switching the capacitor. The logic level of the data, which is high (logic level 1) or low (logic level 0), depends on accumulation of a charge in the capacitor, which means that the logic level of the data depends on the voltage of the capacitor.

Since the data is stored in the form of accumulated charges in the capacitor, theoretically there is no consumption of power. However, since the accumulated charges in the capacitor are discharged and the amount of the accumulated charges decreases due to current leakage caused by a PN bond of the transistor, the data may be lost without power supply. To prevent the data loss, the capacitor of the memory cell should be recharged repeatedly before the data stored in the capacitor is lost in order to retain the amount of charges. This process of repeatedly recharging the memory cell is referred to as a refresh operation.

The refresh operation is performed in the memory device in response to a refresh command applied from a memory controller. The memory controller applies the refresh command to the memory device repeatedly at a predetermined period taking into consideration a data retention time of the memory device. For example, when it is assumed that the data retention time of the memory device is approximately 64 ms then the entire memory cells in the memory device may be refreshed at about 8000 times of inputs of the refresh command. That is, the memory controller applies the refresh command to the memory device approximately 8000 times for approximately 64 ms to perform the refresh operation.

As the integration degree of the memory device is increased, the gap between multiple word lines included in the memory device is decreased and the coupling effect between the neighboring word lines is raised. For this reason, when a particular word line of the memory device is frequently activated, compared with the neighboring word lines during the refresh operation, the data of the memory cells coupled with a plurality of word lines adjacent to the particular word line may be damaged. This phenomenon is referred to as word line disturbance.

SUMMARY

An embodiment of the present invention is directed to a memory device and a memory system that may prevent word line disturbance.

In accordance with an embodiment of the present invention, a memory device may include a cell array having a plurality of word lines, an address counting unit suitable for generating a counting address that is changed whenever one or more of the plurality of word lines are refreshed, and a control unit suitable for selecting a word line corresponding to the counting address among the plurality of word lines and refreshing the selected word line within a first period in response to a refresh command during a first operation mode, within a second period that is longer than the first period during a second operation mode, and within a third period that is shorter than the second period in a high frequency section after the second operation mode begins.

In accordance with another embodiment of the present invention, a memory device may include a cell array configured having a plurality of word lines, an address counting unit suitable for generating a counting address that is changed whenever one or more of the plurality of word lines are refreshed, a refresh control unit suitable for selecting a word line corresponding to the counting address among the plurality of word lines and refreshing the selected word line A times, where A is a rational number equal to or greater than 2, in response to a periodic refresh command, B times, where B is a rational number smaller than A, in response to a periodic second refresh signal and C times, where C is a rational number greater than B, in response to the periodic second refresh signal in a high frequency section, and a second refresh control unit suitable for enabling the periodic second refresh signal from when a second refresh entry command is enabled to when a second refresh exit command is enabled.

In accordance with yet another embodiment of the present invention, a memory system may include a memory device that includes a cell array having a plurality of word lines and suitable for refreshing the cell array within a first period during a first operation mode, within a second period that is longer than the first period during a second operation mode and within a third period that is shorter than the second period in a high frequency section after the second operation mode begins, and a memory controller suitable for inputting the refresh command into the memory device at the set period during the first operation mode, and set the memory device in the second operation mode.

In accordance with still another embodiment of the present invention, a method for operating a memory device including a cell array having a plurality of word lines may include refreshing the cell array within a first period in response to a periodic refresh command, entering a second operation mode in response to a second refresh entry command, and refreshing the cell array within a second period that is longer than the first period in a second operation mode and within a third period that is shorter than the second period during a high frequency section after the second operation mode begins.

DETAILED DESCRIPTION

Figure 1:
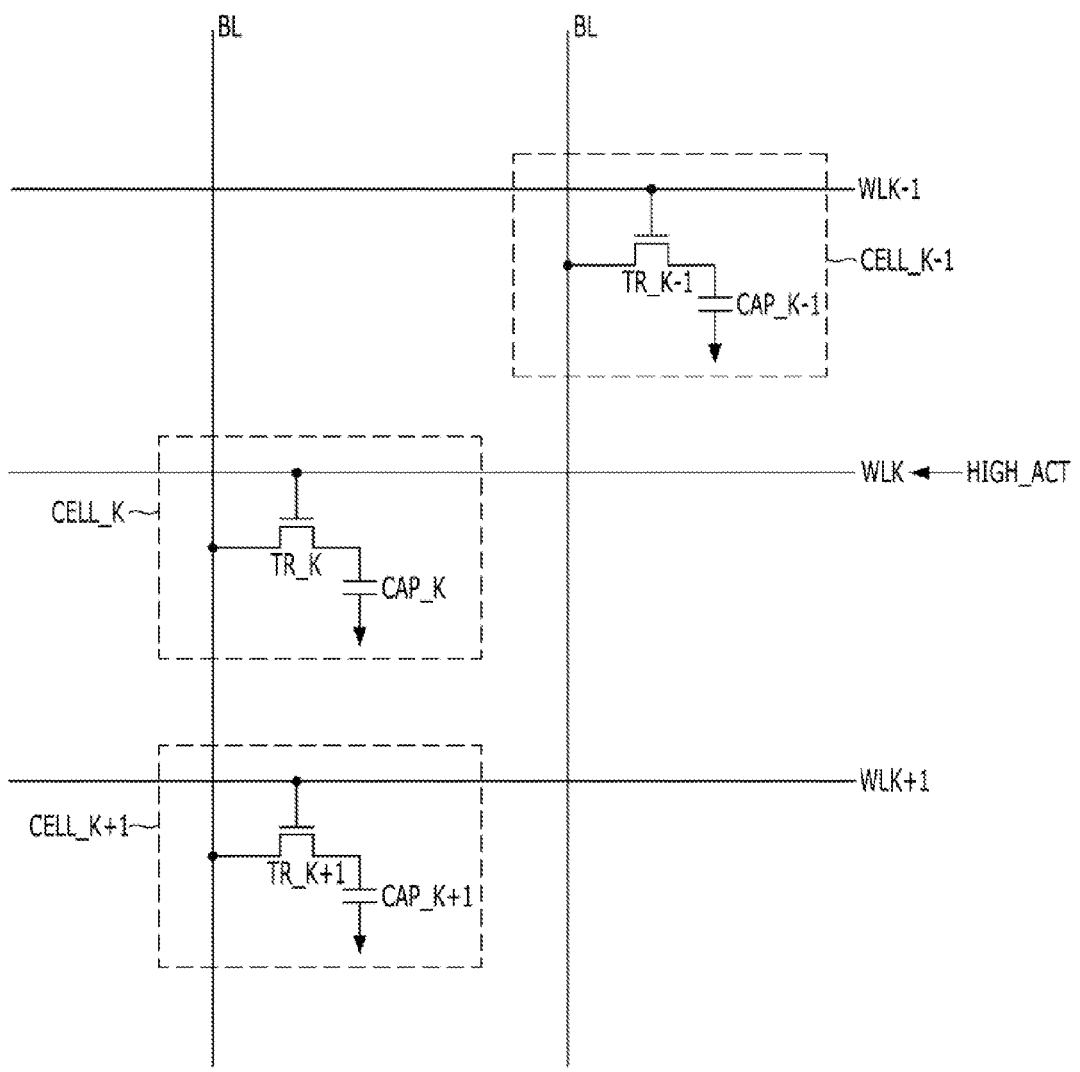
FIG. 1 is a circuit diagram illustrating a portion of a cell array of a memory device.

Exemplary embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete and will fully convey the scope of the present invention to those skilled in the art. Throughout the disclosure, like reference numerals refer to like parts throughout the various figures and embodiments of the present invention.

The drawings are not necessarily to scale and in some instances, proportions may have been exaggerated in order to clearly illustrate features of the embodiments. When a first layer is referred to as being "on" a second layer or "on" a substrate, it not only refers to a case where the first layer is formed directly on the second layer or the substrate but also a case where a third layer exists between the first layer and the second layer or the substrate. It is also noted that in this specification, "connected/coupled" refers to one component not only directly coupling another component but also indirectly coupling another component through an intermediate component. In addition, a singular form may include a plural form as long as it is not specifically mentioned in a sentence.

FIG. 1 is a circuit diagram illustrating a portion of a cell array of a memory device.

FIG. 1 shows a plurality of word lines WLK−1, WLK and WLK+1 disposed in parallel to each other in a cell array. The $K^{th}$ word line WLK marked with HIGH_ACT is a word line that is frequently activated, compared with the $(K-1)^{th}$ word line WLK−1 and the $(K+1)^{th}$ word line WLK+1. The $(K-1)^{th}$ word line WLK−1 and the $(K+1)^{th}$ word line WLK+1 are neighboring word lines disposed adjacent to the $K^{th}$ word line WLK. The word lines WLK−1, WLK and WLK+1 are coupled with memory cells CELL_K−1, CELL_K and CELL_K+1, respectively. The memory cells CELL_K−1, CELL_K and CELL_K+1 also coupled to bit lines BL, include cell transistors TR_K−1, TR_K and TR_K+1 and cell capacitors CAP_K−1, CAP_K and CAP_K+1, respectively.

When the $K^{th}$ word line WLK is activated or deactivated that is, pre-charged, word line disturbance may occur and the voltages of the neighboring word lines WLK−1 and WLK+1 are raised or dropped due to the coupling effect occurring between the $K^{th}$ word line WLK and the neighboring word lines WLK−1 and WLK+1. This may affect the amount of charges stored in the cell capacitors CAP_K−1 and CAP_K+1 of the neighboring word lines WLK−1 and WLK+1. Therefore, as the $K^{th}$ word line WLK is activated and pre-charged frequently and thus the $K^{th}$ word line WLK frequently toggles between the active state and the pre-charge state, the amount of charges stored in the cell capacitors CAP_K−1 and CAP_K+1 or the data stored in the memory cells CELL_K−1 and CELL_K+1 of the neighboring word lines WLK−1 and WLK+1 may be damaged.

Additionally, the data of the memory cells coupled with the neighboring word lines may be damaged since the electromagnetic wave generated as the $K^{th}$ word line WLK toggles between the active state and the pre-charge state causes electrons to go in and out of the cell capacitors of the neighboring word lines.

Figure 2:
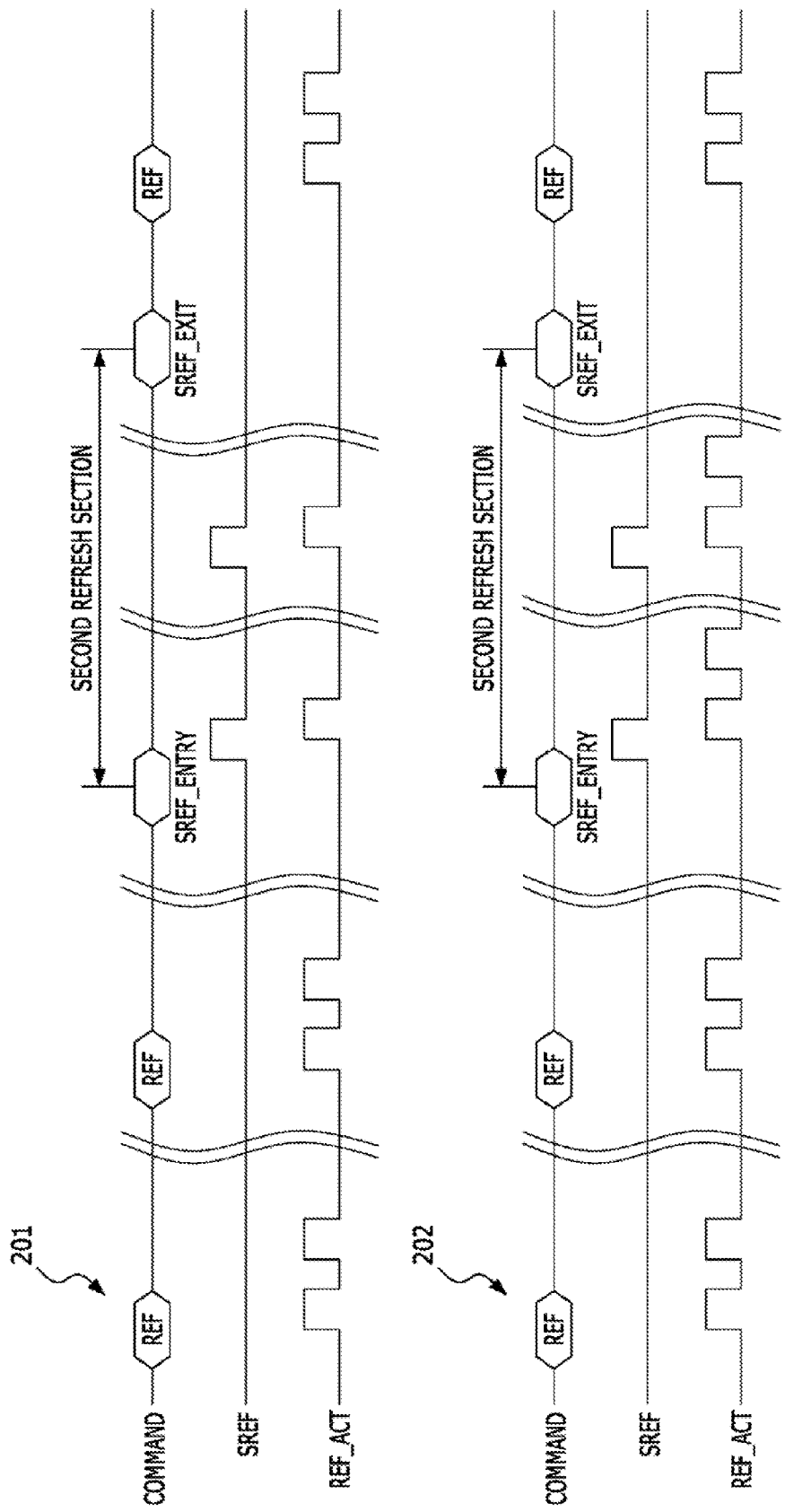
FIG. 2 is a waveform diagram illustrating a refresh operation.

FIG. 2 is a waveform diagram illustrating a refresh operation. A first refresh operation is performed in response to a refresh command during a first operation mode. A second refresh operation is performed without the refresh command during a second operation mode.

During the first operation mode, the memory device may perform the refresh operation once or more in response to a refresh command REF that may be periodically inputted. During the second operation mode, the memory device may perform the refresh operation once or more whenever a second refresh signal SREF may be periodically and internally enabled. A period of the second refresh signal SREF may be the same as a period of the refresh command REF.

A first waveform 201 shown in FIG. 2 illustrates when the refresh operation is performed twice in response to the refresh command REF during the first operation mode and the refresh operation is performed once in response to the second refresh signal SREF in the section of the second operation mode.

A second waveform 202 shown in FIG. 2 illustrates when the refresh operation is performed twice in response to the refresh command REF during the first operation mode and the refresh operation is performed twice in response to the second refresh signal SREF in the section of the second operation mode. The refresh operation may be performed once per single enablement of a refresh signal REF_ACT.

Compared with the refresh operation of the second waveform 202, in the refresh operation of the first waveform 201 the number of the refresh operations is relatively less than in the second operation mode section, which may cause word line disturbance to the memory device.

In the refresh operation of the second waveform 202, the number of the refresh operations is relatively great thus the possibility that the word line disturbance occurs is relatively low, however much power is consumed during the second operation mode.

Figure 3:
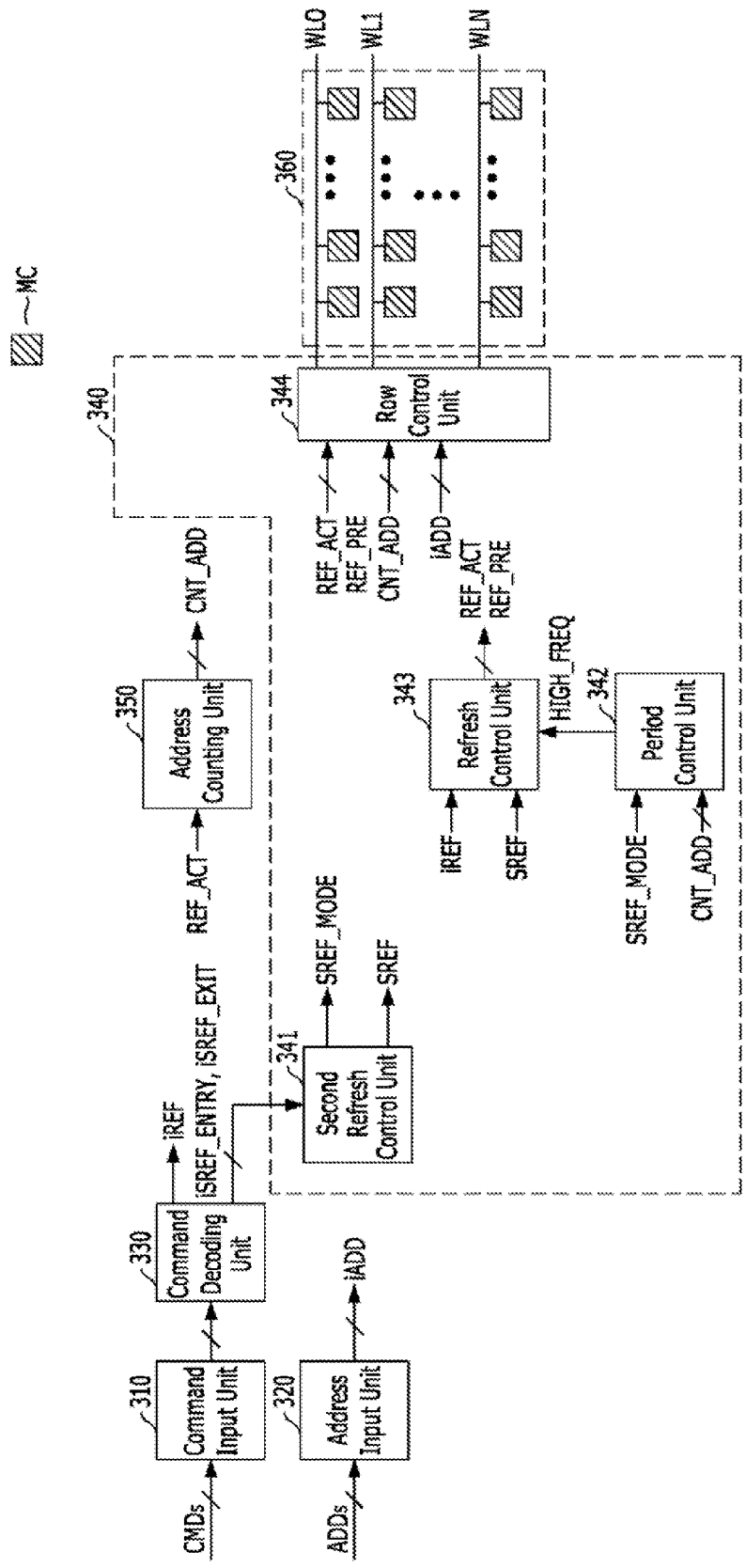
FIG. 3 is a block diagram illustrating a memory device in accordance with an embodiment of the present invention.

FIG. 3 is a block diagram illustrating a memory device in accordance with an embodiment of the present invention.

As shown in FIG. 3, the memory device may include a command input unit 310, an address input unit 320, a command decoding unit 330, a control unit 340, an address counting unit 350 and a cell array 360.

The command input unit 310 may receive commands CMDs applied from the memory controller. The address input unit 320 may receive addresses ADDs applied from the memory controller. Each of the commands CMDs and the addresses ADDs may include multi-bit signals.

The command decoding unit 330 may decode the commands CMDs inputted through the command input unit 310 and generate a refresh command iREF, a second refresh entry command iSREF_ENTRY and a second refresh exit command iSREF_EXIT. When a combination of the inputted commands CMDs represents a refresh command REF, the refresh command iREF may be enabled. When a combination of the inputted commands CMDs represents a second refresh entry command SREF_ENTRY, the second refresh entry command iSREF_ENTRY may be enabled. When a combination of the inputted commands CMDs represents a second refresh exit command SREF_EXIT, the second refresh exit command iSREF_EXIT may be enabled. Besides, the command decoding unit 330 may also decode the inputted commands CMDs and generate such commands as an active command, a pre-charge command, a read command and a write command, but since these commands are not directly related to the operation of the memory device in accordance with the embodiment of the present invention, they are not shown and described in this specification. The memory device may enter a second operation mode in response to the second refresh entry command SREF_ENTRY. The memory device may exit the second operation mode in response to the second refresh exit command SREF_ENTRY During the first operation mode, the command decoding unit 330 may enable the refresh command iREF with a predetermined period in response to the refresh command REF.

The cell array 360 may include a plurality of word lines WL0 to WLN, each coupled with a plurality of memory cells MC. Each memory cell MC may be coupled with a corresponding word line and a corresponding bit line among the multiple word lines WL0 to WLN and the bit lines (not shown in FIG. 3).

The address counting unit 350 may perform a counting operation to generate a counting address CNT_ADD that indicates one of the multiple word lines and is changed whenever the cell array 360 is refreshed or the refresh signal REF_ACT is enabled. The address counting unit 350 may increase a value of the counting address CNT_ADD by '1' whenever the refresh signal REF_ACT is enabled. For example, the value of the counting address CNT_ADD may be changed in such a manner that the next value of the counting address CNT_ADD indicates the $(K+1)^{th}$ word line when the current value of the counting address CNT_ADD indicates the $K^{th}$ word line.

The control unit 340 may sequentially refresh the plurality of word lines WL0 to WLN based on the counting address CNT_ADD. During the first operation mode, the control unit 340 may refresh one by one the plurality of word lines WL0 to WLN in the cell array 350 through the repeated refresh operation within a first period in response to the periodic refresh command iREF. Furthermore, during the second operation mode, the control unit 340 may refresh one by one the plurality of word lines WL0 to WLN in the cell array 360 through the repeated refresh operation within a second period that is longer than the first period. Additionally, during a high frequency section included in a time section of the second operation mode, the control unit 340 may refresh one by one the plurality of word lines WL0 to WLN in the cell array 360 through the repeated refresh operation within a third period that is shorter than the second period. The high frequency section may begin at the beginning of the second operation mode. The control unit 340 may refresh one of the plurality of word lines WL0 to WLN corresponding to the counting address CNT_ADD sent from the address counting unit 350 and changing whenever one of the plurality of word lines WL0 to WLN in the cell array 360 is refreshed or the refresh signal REL_ACT is enabled during the first and second refresh operations, and when another operation that is not the refresh operation, such as an active operation, a read operation, and a write operation, is performed, it may select a word line corresponding to an input address iADD among the multiple word lines WL0 to WLN. Herein, refreshing the cell array 360 means refreshing the word line selected in the cell array 360.

The high frequency section may be set for the memory device to refresh the multiple word lines WL0 to WLN once or more on or after the second operation mode begins. The high frequency section may be a portion, for example, an early section of the time section of the second operation mode. An operation frequency of the refresh operation during the high frequency section may be greater than during the rest of time section of the second refresh operation. The third period may be equal to or less than the first period. That is, the frequency of refreshing the cell array 350 during the high frequency section may be equal to or greater than the frequency of refreshing the cell array 360 during the first operation mode, which is to prevent the word line disturbance.

For a first example, the high frequency section may be set as a time duration corresponding to a set time TSET. The set time TSET may be longer than the third period multiplied by the number of the multiple word lines WL0 to WLN. For example, when the third period is T3 and the number of the plurality of word lines included in the cell array 360 is N+1, the set time TSET may be longer than a time duration of T3×(N+1). During the set time TSET longer than the third period multiplied by the number of the multiple word lines WL0 to WLN, all the plurality of word lines included in the cell array 360 may be refreshed once or more. The control unit 340 may refresh all the plurality of word lines WL0 to WLN in the cell array 360 within the third period during the set time TSET and refresh the cell array 360 within the second period during the rest of time section of the second operation mode.

For a second example, the high frequency section may be set as a time duration corresponding to one or more cycle of refresh operations to the plurality of word lines WL0 to WLN or a time duration from when the second operation mode begins to when the value of the counting address CNT_ADD becomes an initial value INIT_VAL after one cycle of change of value of the counting address CNT_ADD. The initial value INIT_VAL may be an initial value of the counting address CNT_ADD when the second operation mode begins. As described above, the counting address CNT_ADD may indicate one of the plurality of word lines WL0 to WLN and change whenever one of the plurality of word lines WL0 to WLN is refreshed. The value of the counting address CNT_ADD therefore may become the initial value INIT_VAL again after the completion of the cycle of refresh operation to the plurality of word lines WL0 to WLN. The control unit 340 may store the value of the counting address CNT_ADD as the initial value INIT_VAL when the second operation mode begins, refresh the cell array 360 within the third period until the value of the counting address CNT_ADD becomes the initial value INIT_VAL or during the high frequency section and then refresh the cell array 360 within the second period during the rest of the second operation mode.

The high frequency section may also be set in diverse methods other than the two examples described above.

The control unit 340 may include a second refresh control unit 341, a period control unit 342, a refresh control unit 343 and a row control unit 344.

The second refresh control unit 341 may periodically enable the second refresh signal SREF from when the second refresh entry command iSREF_ENTRY is enabled to when the second refresh exit command iSREF_EXIT is enabled. Also, the second refresh control unit 341 may enable a section signal SREF_MODE from when the second refresh entry command iSREF_ENTRY is enabled to when the second refresh exit command iSREF_EXIT is enabled. The section signal SREF_MODE may represent that the memory device is in the second operation mode.

The period control unit 342 may generate a high frequency signal HIGH_FREQ that is enabled during the high frequency section to control the refresh period of the second refresh operation.

For the first example, the period control unit 342 may enable the high frequency signal HIGH_FREQ during the set time TSET or the high frequency section when the section signal SREF_MODE is enabled. According to the first example, the period control unit 342 may include a timer to check the lapse of the set time TSET when the section signal SREF_MODE is enabled. Although FIG. 3 illustrates when the period control unit 342 receives both the section signal SREF_MODE and the counting address CNT_ADD, the period control unit 342 having the timer may not need the counting address CNT_ADD.

For the second example, the period control unit 342 may store the value of the counting address CNT_ADD, which is the initial value INIT_VAL, and enable the high frequency signal HIGH_FREQ when the section signal SREF_MODE is enabled. When the high frequency signal HIGH_FREQ is enabled, the period control unit 342 may compare the current value of the counting address CNT_ADD, which may sequentially change whenever one of the plurality of word lines WL0 to WLN is refreshed, with the stored value or the initial value INIT_VAL. The period control unit 342 period control unit 342 may disable the high frequency signal HIGH_FREQ when the current value of the counting address CNT_ADD becomes the stored value or the initial value INIT_VAL again after the completion of a cycle of refresh operation to the plurality of word lines WL0 to WLN.

The refresh control unit 343 may generate the refresh signal REF_ACT for refreshing the cell array 360 during the first refresh operation and the second refresh operation. The refresh control unit 343 may enable the refresh signal REF_ACT "A" times, where "A" is a rational number equal to or greater than 2, in response to the refresh command iREF during the first operation mode. The refresh control unit 343 may enable the refresh signal REF_ACT "B" times, where B is a rational number smaller than A, during the disablement of the high frequency signal HIGH_FREQ, and "C" times, where C is a rational number greater than B, during the enablement of the high frequency signal HIGH_FREQ, in response to the second refresh signal SREF in the second operation mode. Therefore, "A", "B" and "C" may be the numbers of the refresh operations per the refresh command REF or the second refresh signal SREF. When the period of the periodic second refresh signal SREF is the same as the period of the periodic refresh command REF, C may be equal to or greater than A.

Described hereafter is when each value of "A" and "C" is 2 (A=C=2) and a value of "B" is 1 (B=1). The period of the periodic refresh signal REF_ACT during the first operation mode may correspond to the first period. The period of the periodic refresh signal REF_ACT in the high frequency section may correspond to the third period. Since the period of the refresh command iREF is the same as the period of the second refresh signal SREF and the numbers of enablement of the refresh signal REF_ACT or the numbers of the refresh operations per enablement of the refresh command iREF and the second refresh signal SREF is the same, which is 2, the first period and the third period may be the same. Since the refresh control unit 343 enables the refresh signal REF_ACT once per enablement of the second refresh signal SREF during disablement of the high frequency signal HIGH_FREQ, the second period may be twice the first period and the third period.

For instance, it is possible to design "A" equal to 2, "B" equal to 1 and "C" equal to 2.5. As described above, the "A", "B" and "C" may be the numbers of the refresh operations per the refresh command REF or the second refresh signal SREF. As an example, "C" equal to 2.5 (5/2) may mean that the cell array is refreshed five times during two times of enablement of the second refresh signal SREF. Additionally, "A" equal to 2 may mean that the refresh signal REF_ACT is enabled or the cell array is refreshed twice during one enablement of the refresh command iREF.

The refresh control unit 343 may enable a pre-charge signal REF_PRE after the refresh signal REF_ACT is enabled and then after a predetermined time for sufficiently activating a word line passes.

The row control unit 344 may refresh one of the plurality of word lines WL0 to WLN corresponding to the counting address CNT_ADD in response to the refresh signal REF_ACT. The row control unit 344 may activate one of the plurality of word lines WL0 to WLN corresponding to the counting address CNT_ADD when the refresh signal REF_ACT is enabled and pre-charge the activated word line when the pre-charge signal REF_PRE is enabled.

Figure 4:
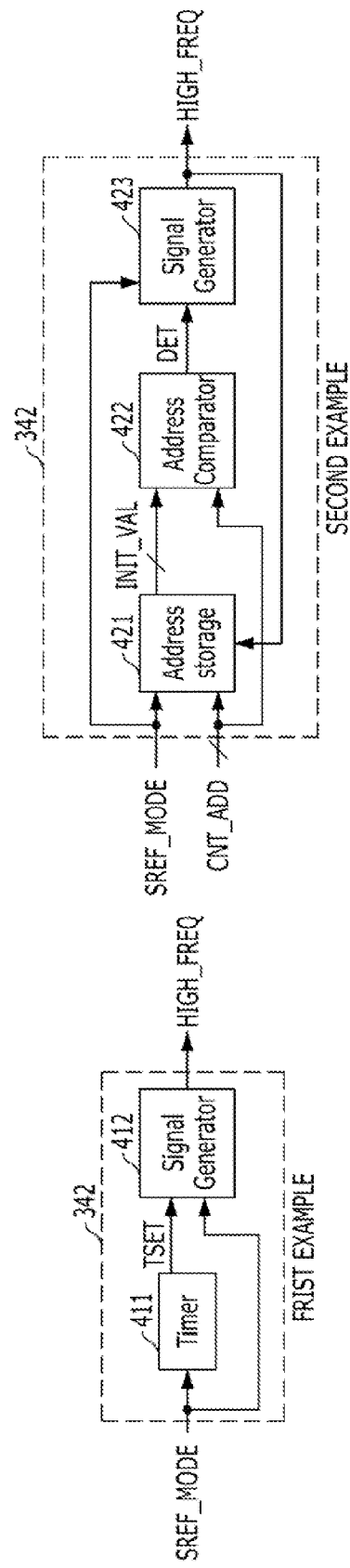
FIG. 4 is a block diagram illustrating two examples of a period control unit of the memory device shown in FIG. 3.

FIG. 4 is a block diagram illustrating two examples of the period control unit 342 of the memory device shown in FIG. 3.

For the first example, the period control unit 342 may set the high frequency section based on the set time TSET. For the second example, the period control unit 342 may set the high frequency section based on the initial value INIT_VAL.

Hereafter, the period control unit 342 is described with reference to FIGS. 3 and 4.

According to the first example, the period control unit 342 may include a timer 411 and a signal generator 412. The timer 411 may be activated when the section signal SREF_MODE is enabled, may enable a pass signal TSET and may be initialized when time passes as much as the set time TSET. The signal generator 412 may enable the high frequency signal HIGH_FREQ from when the section signal SREF_MODE is enabled to when the pass signal TSET is enabled.

According the second example, the period control unit 342 may include an address storage 421, an address comparator 422 and a signal generator 423. The address storage 421 may store the value of the counting address CNT_ADD when the section signal SREF_MODE is enabled. The address storage 421 may store the value of the counting address CNT_ADD as the initial value INIT_VAL when the second operation mode begins and keep the initial value INIT_VAL during when the high frequency signal HIGH_FREQ is enabled. The address comparator 422 may compare the initial value INIT_VAL with the counting address CNT_ADD, which may sequentially change whenever one of the plurality of word lines WL0 to WLN is refreshed, during the high frequency section. When the counting address CNT_ADD becomes the initial value INIT_VAL after the completion of the cycle of refresh operation to the plurality of word lines WL0 to WLN, the address comparator 422 may enable a detection signal DET. The signal generator 423 may enable the high frequency signal HIGH_FREQ from when the section signal SREF_MODE is enabled to when the detection signal DET is enabled.

Figure 5:
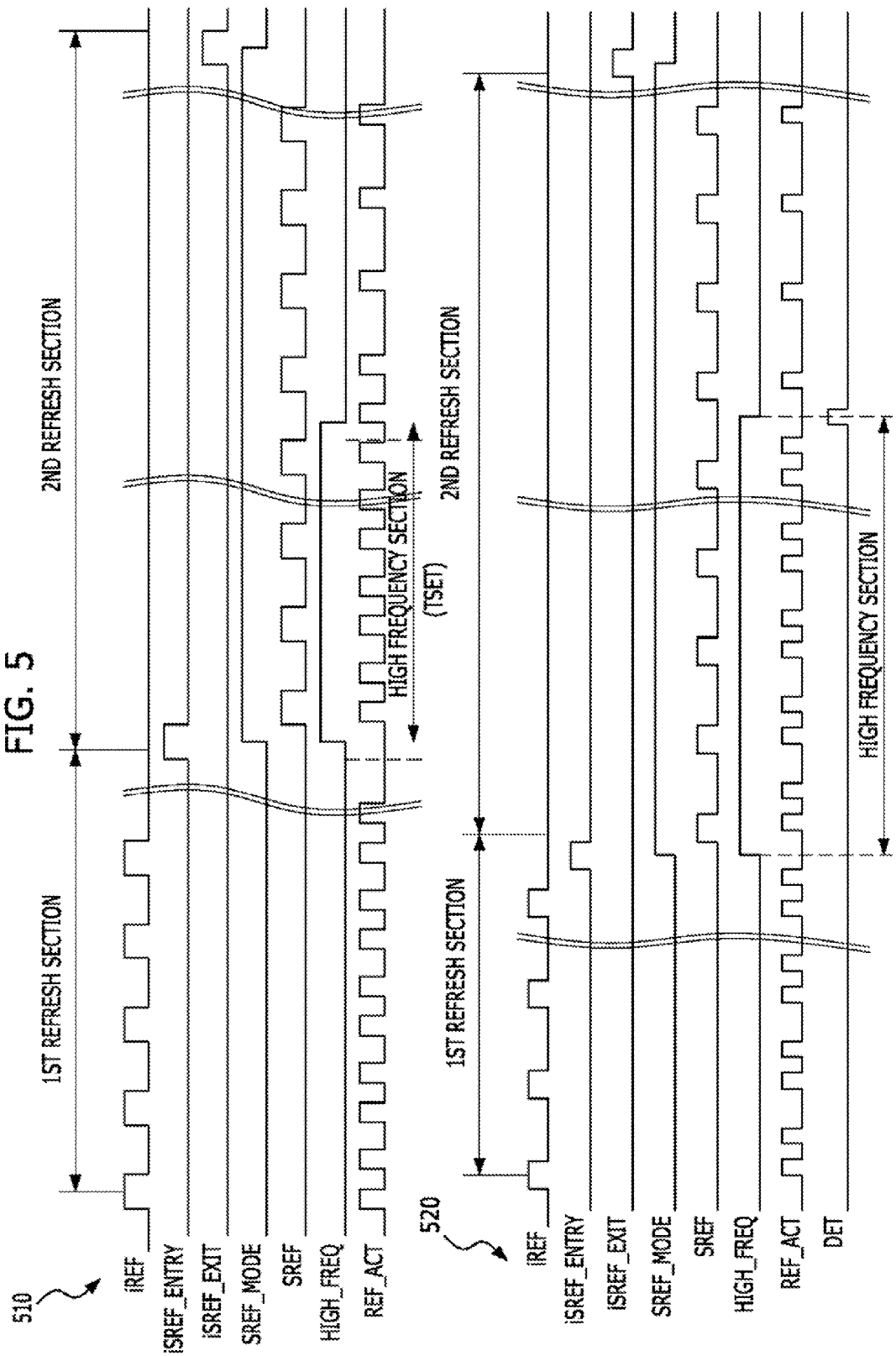
FIG. 5 is a waveform diagram illustrating an operation of the memory device shown in FIG. 3.

FIG. 5 is a waveform diagram illustrating an operation of the memory device shown in FIG. 3.

A first waveform 510 illustrates the operation of the memory device as the first example that the high frequency section is set, based on the set time TSET. A second waveform 520 illustrates the operation of the memory device as the second example that the high frequency section is set, based on the initial value INIT_VAL.

Hereafter, the operation of the memory device is described with reference to FIGS. 3 to 5.

As illustrated in the first waveform 510, the memory device may perform the first refresh operation in response to the refresh signal REF_ACT, which enables twice per the refresh command iREF ("A" equal to 2). In the high frequency section, the memory device may perform the second refresh operation in response to the refresh signal REF_ACT, which enables twice per the second refresh signal SREF ("C" equal to 2). For the first example, the duration of the high frequency section may be the set time TSET. When the high frequency section ends, the memory device may perform the second refresh operation in response to the refresh signal REF_ACT, which enables once per the second refresh signal SREF ("B" equal to 1).

As illustrated in the second waveform 520, the high frequency section may be set based on the result of comparing the initial value INIT_VAL with the counting address CNT_ADD. When the address comparator 422 enables a detection signal DET, the high frequency section may end.

The memory device in accordance with the embodiment of the present invention may reduce the amount of current consumed for the refresh operation while preventing word line disturbance by performing the second refresh operation at a frequency similar to or higher than the frequency of the first refresh operation during a portion of the time section of the second refresh operation, e.g., the high frequency section and performing the second refresh operation at a frequency lower than the frequency of the first refresh operation during the rest portion of the time section of the second refresh operation.

Figure 6:
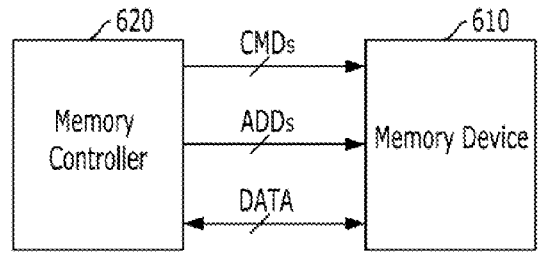
FIG. 6 is a block diagram illustrating a memory system in accordance with an embodiment of the present invention.

FIG. 6 is a block diagram illustrating a memory system in accordance with an embodiment of the present invention.

Referring to FIG. 6, the memory system may include a memory device 610 and a memory controller 620.

Hereafter, the memory system is described with reference to FIGS. 3 to 6.

The memory controller 620 may control the operation of the memory device 610 by applying commands CMDs and addresses ADDs. The memory device 610 and the memory controller 620 may communicate data to each other during a read operation and a write operation. The memory controller 620 may input the commands CMDs indicating a refresh command REF, a second refresh entry command SREF_ENTRY and a second refresh exit command SREF_EXIT to the memory device 610. The memory controller 620 may refresh a cell array 360 included in the memory device 610 at a first period by inputting the periodic refresh command REF. The memory controller 620 does not have to input the addresses ADDS to the memory device 610 during a first refresh operation and a second refresh operation, because the memory device 610 may generate internally the counting address CNT_ADD for selecting one of the plurality of word lines WL0 to WLN to be refreshed.

The memory device 610 (refer to FIG. 3) may receive the commands CMDs, periodically enable a refresh command iREF and refresh the cell array 360 within the first period in response to the refresh command REF during the first operation mode. The memory device 610 may receive the commands CMDs, enable a second refresh entry command iSREF_ENTRY and enable a second refresh exit command iSREF_EXIT during the second operation mode. The memory device 610 may periodically enable a second refresh signal SREF and refresh the cell array 360 in response to the second refresh signal SREF during the second operation mode. The memory device 610 may refresh the cell array 360 within the third period during the high frequency section and within the second period during the rest of time section of the second operation mode.

Figure 7:
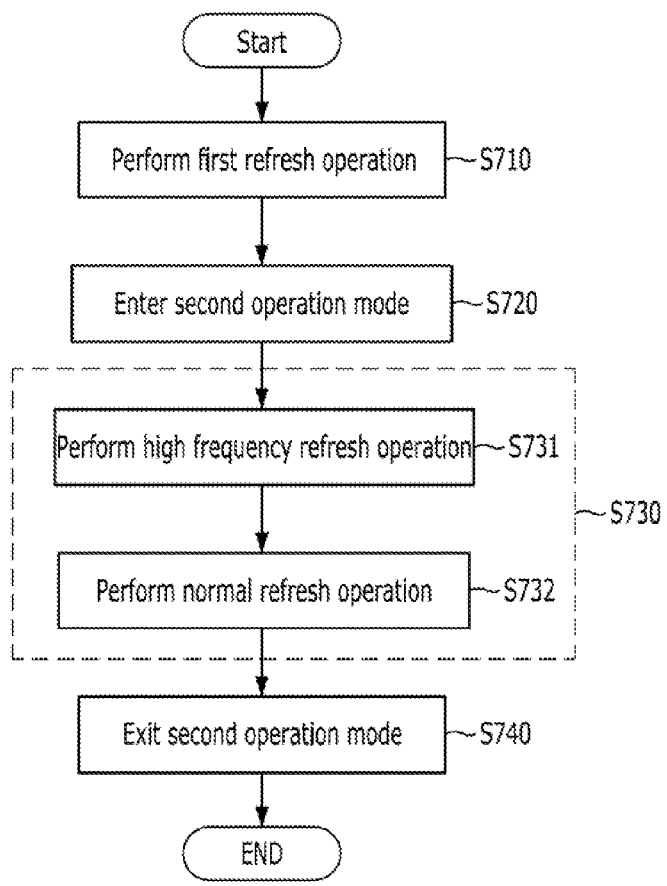
FIG. 7 is a flowchart illustrating a method for operating a memory device in accordance with an embodiment of the present invention.

FIG. 7 is a flowchart illustrating a method for operating a memory device in accordance with an embodiment of the present invention.

Referring to FIG. 7, the method for operating the memory device having a cell array that has a plurality of word lines may include performing the first refresh operation at step S710, entering the second operation mode at step S720, performing the second refresh operation at step S730 and exiting the second operation mode at step S740.

Hereafter, the method for operating the memory device is described with reference to FIGS. 3 to 7.

At the first refresh operation of step S710 the memory device may refresh the cell array 360 within the first period in response to the refresh command REF that may be periodically inputted. For example, the memory device may perform the first refresh operation in response to the refresh signal REF_ACT, which enables twice per the refresh command REF ("A" equal to 2).

At the step S720 of entering the second operation mode, the memory device may enter the second operation mode in response to the second refresh entry command SREF_ENTRY.

The step S730 of performing the second operation mode may include a high frequency refresh operation of step S731 and a normal frequency refresh operation of step S732. The high frequency refresh operation of step S731 corresponds to the above-described second refresh operation during the high frequency section and the memory device may refresh the cell array 360 within the third period which is the same as or shorter than the first period at step S731. The normal frequency refresh operation of step S732 corresponds to the above-described second refresh operation during the rest of time section of the second operation mode and the memory device may refresh the cell array 360 within the second period which is shorter than the first period and the third period at step S732.

At the step S740 of exiting the second operation mode, the memory device may exit the second operation mode in response to the second refresh operation exit command SELF_EXIT.

According to the method for operating a memory device in accordance with the embodiment of the present invention, the second refresh operation is performed with a frequency similar to or higher than the frequency of the first refresh operation during a portion of time section of the second operation mode, e.g., the high frequency section and with a frequency lower than the frequency of the first refresh operation during the rest portion of time section of the second operation mode. In this way, the amount of current consumed for the refresh operation may be decreased while preventing word line disturbance.

Herein, the reference symbols 'REF', 'SREF_ENTRY' and 'SREF_EXIT' may be external commands represented by a combination of command signals CMDs inputted from the memory controller and the reference symbols 'iREF', 'iSREF_ENTRY' and 'iSREF_EXIT' may be internal commands that are enabled by a command decoding unit in response to a combination of the above command signals CMDs. The first refresh operation may be an auto refresh operation and the second refresh operation may be a self refresh operation.

According to an embodiment of the present invention, when a second operation mode begins, a memory device and a memory system may operate normally by rapidly refreshing all word lines and thus preventing deterioration of data caused due to word line disturbance.

While the present invention has been described with respect to the specific embodiments, it will be apparent to those skilled in the art that various changes and modifications may be made without departing from the spirit and scope of the invention as defined in the following claims.

What is claimed is:

1. A memory device, comprising:
   a plurality of word lines;
   an address counting unit configured to generate a counting address;
   a period control unit configured to store the counting address and enable a frequency control signal when a self refresh mode is enabled, and disable the frequency control signal when the counting address becomes a stored address;
   a self refresh control unit configured to periodically enable a self refresh signal during the self refresh mode; and
   a refresh control unit configured to refresh a word line selected by the counting address within a first period in response to a periodic refresh command during an auto refresh mode, refresh a word line selected by the counting address within a second period that is longer than the first period during the self refresh mode, but refresh a word line selected by the counting address within a third period which is shorter than the second period during an enabled section of the frequency control signal.

2. The memory device of claim 1, wherein the plurality of word lines is refreshed once or more during the enabled section of the frequency control signal.

3. The memory device of claim 1, wherein the third period is equal to or shorter than the first period.

4. The memory device of claim 1, wherein the enabled section of the frequency control signal is set to be longer than the third period multiplied by a number of the plurality of word lines.

5. The memory device of claim 1, wherein a period control unit includes:
an address storage configured to store the counting address as the initial value when the self refresh mode is enabled;
an address comparator configured to compare the initial value with the counting address and enable a detection signal when counting address becomes the initial value after the completion of the cycle of refresh operation to the plurality of word lines during the enabled section of the frequency control signal; and
a signal generator configured to enable the frequency control signal when a self refresh mode is enabled, and disable the frequency control signal when the detection signal is enabled.

6. The memory device of claim 1, wherein a refresh control unit configured to enable a refresh signal A times, where A is a rational number equal to or greater than 2, in response to a periodic refresh command during the first operation mode, B times, where B is a rational number smaller than A, in response to the periodic self refresh signal during the self refresh mode, but C times, where C is a rational number greater than B, in response to the periodic self refresh signal the enabled section of the frequency control signal.

7. The memory device of claim 6, wherein the address counting unit sequentially changes the counting address whenever one or more of a plurality of word lines are refreshed.

8. A memory device, comprising:
a cell array configured having a plurality of word lines;
an address counting unit configured to generate a counting address;
a period control unit configured to store the counting address and enable a frequency control signal when a self refresh mode is enabled, and disable the frequency control signal when the counting address becomes a stored address;
a self refresh control unit configured to periodically enable a self refresh signal during the self refresh mode; and
a refresh control unit configured to refresh N number of word lines in response to a periodic refresh command during an auto refresh mode, where N is a natural number equal to or greater than 2, one word lines in response to the self refresh signal during the self refresh mode, but N number of word lines in response to the self refresh signal during an enabled section of the frequency control signal.

9. The memory device of claim 8, wherein the plurality of word lines is refreshed once or more during the enabled section of the frequency control signal.

10. The memory device of claim 8, wherein a period of the periodic second refresh signal is equal to a period of the periodic refresh command and C is equal to or greater than A.

11. A memory system, comprising:
a memory controller configured to input a refresh command into the memory device at the set period during auto refresh mode, and set the memory device in a self refresh mode; and
a memory device, comprising:
a plurality of word lines;
an address counting unit configured to generate a counting address;
a period control unit configured to store the counting address and enable a frequency control signal when the self refresh mode is enabled, and disable the frequency control signal when the counting address becomes a stored address;
a self refresh control unit configured to periodically enable a self refresh signal during the self refresh mode; and
a refresh control unit configured to refresh a word line selected by the counting address within a first period in response to a periodic refresh command during an auto refresh mode, refresh a word line selected by the counting address within a second period that is longer than the first period during the self refresh mode, but refresh a word line selected by the counting address within a third period which is shorter than the second period during an enabled section of the frequency control signal.

12. The memory system of claim 11, wherein the plurality of word lines is refreshed once or more during the enabled section of the frequency control signal.

13. The memory system of claim 11, wherein the third period is equal to or shorter than the first period.

14. The memory system of claim 11, wherein the enabled section of the frequency control signal is set to be longer than the third period multiplied by a number of the plurality of word lines.

15. The memory system of claim 11, wherein a period control unit includes:
an address storage configured to store the counting address as the initial value when the self refresh mode is enabled;
an address comparator configured to compare the initial value with the counting address and enable a detection signal when counting address becomes the initial value after the completion of the cycle of refresh operation to the plurality of word lines during the enabled section of the frequency control signal; and
a signal generator configured to enable the frequency control signal when a self refresh mode is enabled, and disable the frequency control signal when the detection signal is enabled.

* * * * *